United States Patent
David et al.

(10) Patent No.: US 10,585,152 B2
(45) Date of Patent: Mar. 10, 2020

(54) TEMPERATURE-COMPENSATED MAGNETO-RESISTIVE SENSOR

(71) Applicant: Allegro MicroSystems, LLC, Manchester, NH (US)

(72) Inventors: Paul A. David, Bow, NH (US); William P. Taylor, Amherst, NH (US)

(73) Assignee: ALLEGRO MICROSYSTEMS, LLC, Manchester, NH (US)

( * ) Notice: Subject to any disclaimer, the term of this patent is extended or adjusted under 35 U.S.C. 154(b) by 0 days.

(21) Appl. No.: 16/018,291

(22) Filed: Jun. 26, 2018

(65) Prior Publication Data
US 2018/0299517 A1 Oct. 18, 2018

Related U.S. Application Data

(62) Division of application No. 15/212,643, filed on Jul. 18, 2016, now Pat. No. 10,036,785.

(51) Int. Cl.
*G01R 33/09* (2006.01)
*G01R 33/00* (2006.01)

(52) U.S. Cl.
CPC ......... *G01R 33/09* (2013.01); *G01R 33/0052* (2013.01); *G01R 33/093* (2013.01); *G01R 33/098* (2013.01)

(58) Field of Classification Search
CPC ........ G01D 5/145; G01D 5/147; G01R 33/09; G01R 33/093; G01B 7/003
USPC ...................... 324/207.21, 200–263, 750.01; 257/421–427; 702/1–199; 73/66–132
See application file for complete search history.

(56) References Cited

U.S. PATENT DOCUMENTS

| | | | |
|---|---|---|---|
| 6,057,049 A | 5/2000 | Fuke et al. | |
| 7,259,545 B2 | 8/2007 | Stauth et al. | |
| 7,518,354 B2 | 4/2009 | Stauth et al. | |
| 7,746,056 B2 | 6/2010 | Stauth et al. | |
| 7,759,800 B2 * | 7/2010 | Rigg ................. | H01L 21/76898 257/774 |
| 7,777,607 B2 | 8/2010 | Taylor et al. | |
| 7,795,862 B2 | 9/2010 | Doogue et al. | |
| 7,859,255 B2 | 12/2010 | Doogue et al. | |
| 7,969,144 B2 | 6/2011 | Jajtic et al. | |
| 8,203,332 B2 | 6/2012 | Guo et al. | |
| 8,629,520 B2 * | 1/2014 | Doogue ............... | B82Y 25/00 257/422 |
| 10,036,785 B2 | 7/2018 | David et al. | |
| 2008/0100290 A1 * | 5/2008 | Shoji .................. | B82Y 25/00 324/252 |

(Continued)

OTHER PUBLICATIONS

Notice of Allowance dated May 25, 2018 for U.S. Appl. No. 15/212,643; 8 Pages.

(Continued)

*Primary Examiner* — Patrick Assouad
*Assistant Examiner* — Taqi R Nasir
(74) *Attorney, Agent, or Firm* — Daly, Crowley, Mofford & Durkee, LLP

(57) ABSTRACT

In one aspect, an integrated circuit (IC) includes a sensor that includes a first magnetoresistive (MR) element and a second MR element less active to a presence of a magnetic field than the first MR element. The second MR element includes a metal layer diffused into other layers of the second MR element.

15 Claims, 10 Drawing Sheets

(56) References Cited

U.S. PATENT DOCUMENTS

2008/0266938 A1* 10/2008 Molla .................. G11C 5/02
                                                        365/158
2010/0072988 A1    3/2010 Hammerschmidt et al.
2012/0306490 A1* 12/2012 Furuichi ............. H01L 43/12
                                                        324/252

OTHER PUBLICATIONS

Office Action dated Dec. 8, 2017 for U.S. Appl. No. 15/212,643; 10 Pages.
Response to Office Action dated Dec. 8, 2017 for U.S. Appl. No. 15/212,643, filed Mar. 1, 2018; 9 Pages.
Response to Restriction Requirement dated Sep. 7, 2017 for U.S. Appl. No. 15/212,643, filed Sep. 29, 2017; 2 Pages.
Restriction Requirement dated Sep. 7, 2017 for U.S. Appl. No. 15/212,643; 9 Pages.

* cited by examiner

TEMPERATURE-COMPENSATED MAGNETO-RESISTIVE SENSOR

CROSS REFERENCE TO RELATED APPLICATIONS

This application is a divisional application of and claims the benefit of and priority to U.S. patent application Ser. No. 15/212,643, filed on Jul. 18, 2016, which application is incorporated by reference herein in its entirety.

BACKGROUND

Magnetoresistance elements are known to be manufactured in a variety of configurations, including, but not limited to giant magnetoresistance (GMR) elements and anisotropic magnetoresistance (AMR) elements.

The magnetoresistance element is used in a variety of applications, including, but not limited to current sensors responsive to an electrical current, proximity detectors responsive to proximity of a ferromagnetic object, for example, ferrous gear teeth, and magnetic field sensors responsive to a magnetic field external to the magnetic field sensor.

The magnetoresistance element has an electrical resistance that changes generally in proportion to a magnetic field in a direction of a maximum response axis of the magnetoresistance element. However, the electrical resistance changes not only in proportion to the magnetic field, but also in proportion to a temperature of the magnetoresistance element. The effect of temperature can be characterized as a temperature coefficient in units of resistance per degree temperature.

SUMMARY

In one aspect, an integrated circuit (IC) includes a sensor that includes a first magnetoresistive (MR) element and a second MR element less active to a presence of a magnetic field than the first MR element. The second MR element includes a metal layer diffused into other layers of the second MR element.

In another aspect, a method includes applying heat to a semiconductor structure that includes a first magnetoresistive (MR) element to diffuse at least one metal layer of the first MR element into other layers of the first MR element. The method also includes fabricating a second MR element on to the semiconductor device after applying the heat.

DETAIL DESCRIPTION

Described herein are techniques to fabricate a temperature-compensated magneto-resistive sensor having at least one active magnetoresistance (MR) element and at least one less active MR on a single integrated circuit (IC). In one particular example, the less active MR element is similar to an active MR element, but the less active MR element has been purposefully damaged by heat so that one or more of the metal layers of the less active MR element are diffused into other layers of the less active MR element.

As used herein an active MR element responds to the presence of a magnetic field. As used herein a less active MR element responds less to the presence of a magnetic field than an active MR element. In one example, a less active MR element has 10% or less total change in nominal resistance when a magnetic field is present. In another example, a less active MR element has 1% or less total change in nominal resistance when a magnetic field is present. In a further example, a less active MR element has 0.1% or less total change in nominal resistance when a magnetic field is present.

As used herein, the term "magnetic field sensing element" is used to describe a variety of electronic elements that can sense a magnetic field. The magnetic field sensing element may be, but is not limited to an MR element. As is known, there are different types of MR elements, which include a metallic (or metal-based) MR element such as a giant magnetoresistance (GMR) element, a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Figure 1:
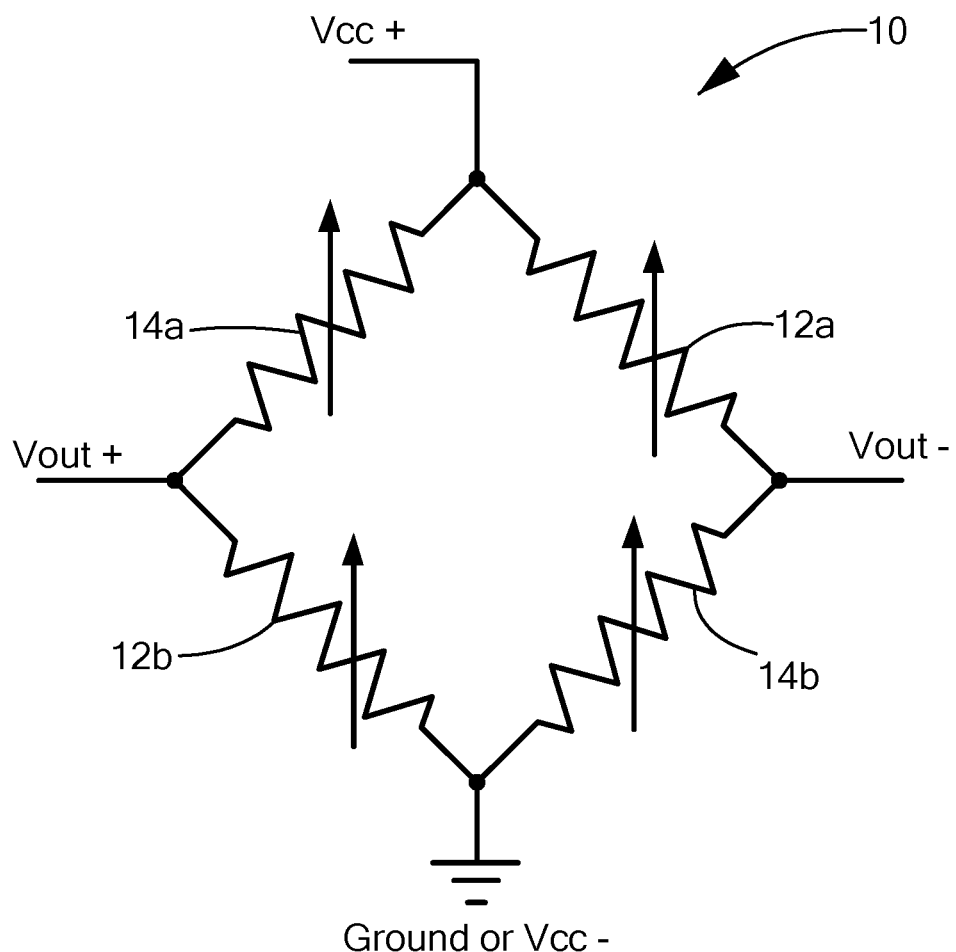
FIG. 1 is a circuit diagram of a Wheatstone bridge with two active magnetoresistance (MR) elements and two less active MR elements.

Referring to FIG. 1, a Wheatstone bridge circuit 10 includes first and second active MR elements 12a, 12b, respectively and first and second less active MR elements 14a, 14b, respectively. In one particular example the MR elements 12a, 12b, 14a, 14b may be MTJ elements, TMR elements or GMR elements.

In one particular example, each of the MR elements 12a, 12b, 14a, 14b includes a plurality of layers. The plurality of layers, for example, may include an antiferromagnetic layer, a first pinned layer, a first non-magnetic layer, a second pinned layer, a second non-magnetic layer and a free layer. In one particular example of an MR element, the antiferromagnetic layer includes PtMn, the first and second pinned layers include CoFe, the first and second non-magnetic layers include a selected one of Ir and Ru, and the free layer 22 includes NiFe. However, one of ordinary skill in the art will understand that other layers and materials may be provided in an MR element.

Since the MR elements 12a, 12b have the same temperature coefficient as the MR elements 14a, 14b, an output voltage difference between Vout+ and Vout− of the Wheatstone bridge circuit 10 is generally not responsive to temperature changes. However, the output voltage difference is responsive to a magnetic field in which the active MR elements 12a, 12b are placed and also to a much lesser degree to the less active MR elements 14a, 14b.

Figure 2:
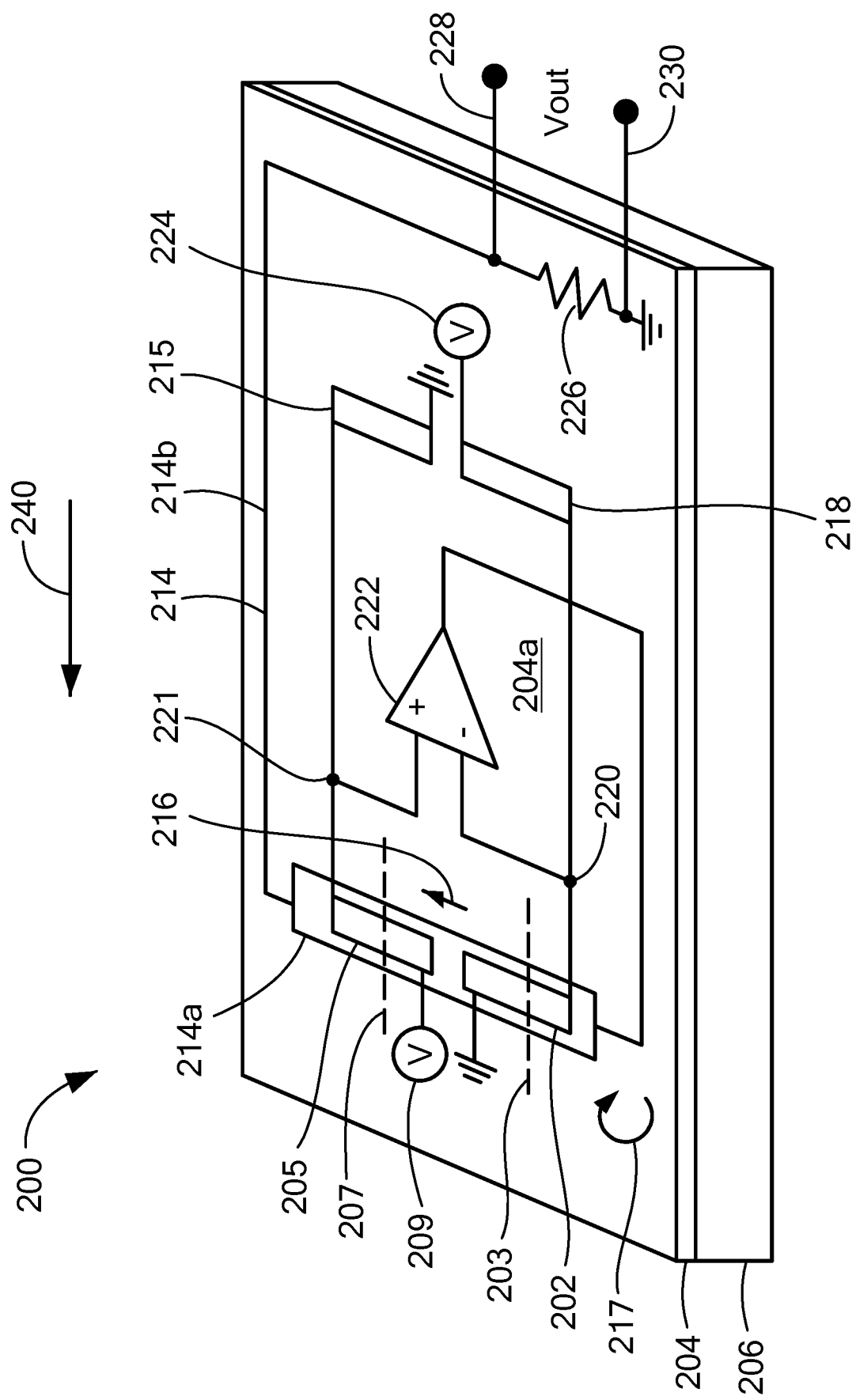
FIG. 2 is a diagram of a magnetic field sensor having two MR elements and two less active MR elements.
Figure 3:
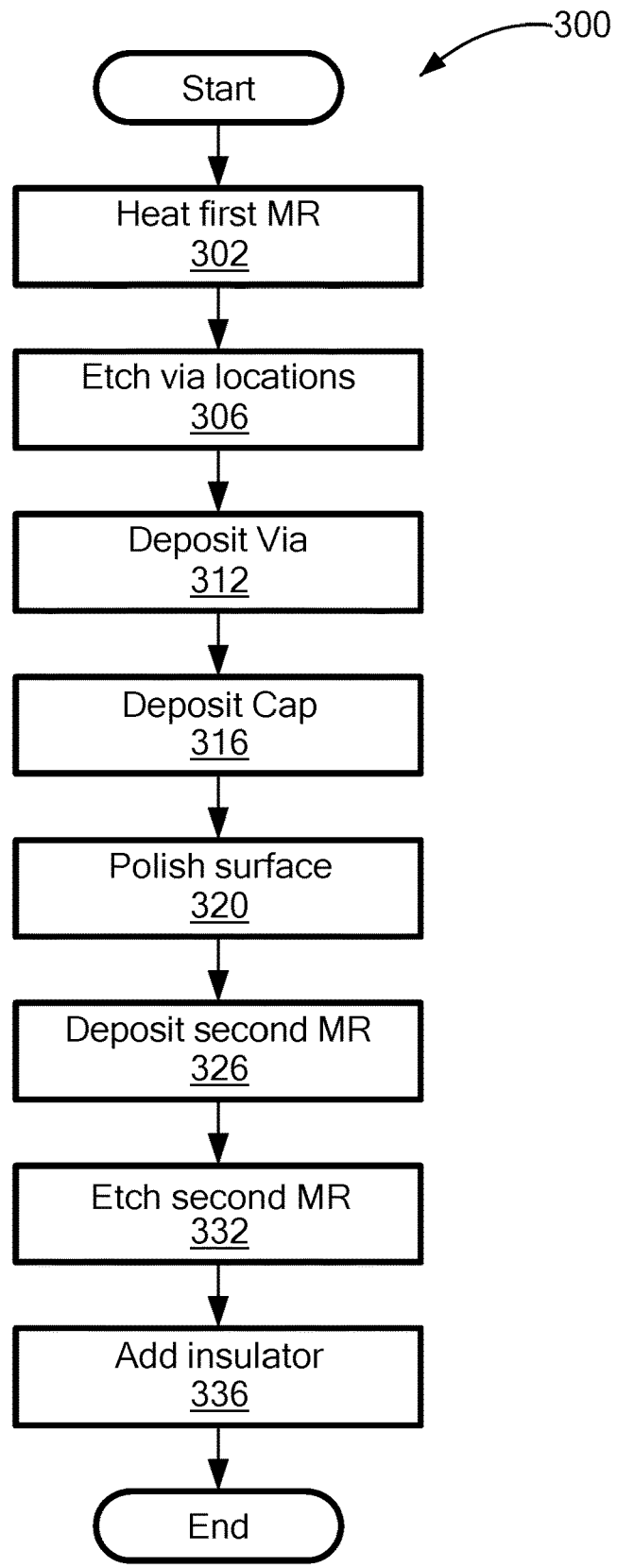
FIG. 3 is a block diagram of an example of a process to fabricate a temperature-compensated magneto-resistive sensor having at least one active MR element and at least one active MR element on a single IC.

Referring to FIG. 2, in one example, an electronic circuit 200 in the form of a magnetic field sensor includes a silicon substrate 204, active MR elements 202, 205 and less active MR 215, 218 disposed over a surface 204a of the silicon substrate 204. A conductor 214 is also disposed over the surface 204a of the silicon substrate 204 proximate to the magnetoresistance elements. The magnetic field sensor 200 is adapted to sense an external magnetic field 240 and to provide an output signal, Vout, proportional to the magnetic field 240.

In operation, a current 216 flows through a first portion 214a of conductor 214, thereby generating a magnetic field 217. The magnetic field 217 is in the opposite direction with respect to the external magnetic field 240. Thus, the magnetic field 217 tends to cancel the external magnetic field 240.

A first voltage source 224, here integrated in the silicon substrate 204, provides a current through the MR element 218 and the MR element 202, and therefore, generates a voltage at node 220 having a magnitude related to the magnetic field experienced by the MR element 202. Similarly, a second voltage source 209, also here integrated in the silicon substrate 204, provides a current through the MR element 205 and the MR element 215, and therefore, generates a voltage at node 221 having a magnitude related to the magnetic field experienced by the MR element 205. In one embodiment, the first and the second voltage sources 224, 209 supply the same voltage and are provided by a single voltage source. An amplifier 221 provides the secondary current 216 to the secondary conductor 214 in response to a voltage difference between the nodes 220 and 221.

The MR element 202 has a response axis 203 and the MR element 205 has a response axis 207. In one particular example, the MR elements 202, 205 may be polarized, or pinned in the same direction. The current 216 passes by the MR elements 202, 205, in the same direction. Therefore, when exposed to the magnetic field 217, the voltage at the node 220 moves in one voltage direction and the voltage at the node 221 moves in the other voltage direction.

In the particular arrangement shown, the node 220 is coupled to a negative input of the amplifier 222 and the node 221 is coupled to a positive input of the amplifier 222. The voltage at the node 221 tends to increase while the voltage at the node 220 tends to decrease in response to the external magnetic field 240. However, as described above, the magnetic field 217 tends to oppose the external magnetic field 240.

The MR elements 202, 205 are oriented such that the response axes 203, 207 are aligned with the external magnetic field 240 and also with the magnetic field 217. The magnetic field experienced by the MR elements 202, 205 is the sum of the magnetic field 217 and the external magnetic field 240 along the response axes 203, 207 respectively.

Since the magnetic field 217 is opposite in direction to the external magnetic field 240 along the response axes 203, 207 the magnetic field 217 tends to cancel the external magnetic field 240. The amplifier 221 generates the current 216 in proportion to the voltage difference between the node 220 and the node 221. Thus, the amplifier 222 provides the current 216 at a level necessary to generate the magnetic field 217 sufficient to cancel the external magnetic field 240 along the response axes 203, 207 so that the total magnetic field experienced by each of the MR elements 202, 205 is substantially zero gauss.

The current 216 passes through a resistor 226 thereby generating an output voltage, Vout, between output terminals 228, 230 in proportion to the current 216. With this arrangement, the output voltage, Vout, is proportional to the magnetic field 217 necessary to cancel the external magnetic field 240, and is thus proportional to the external magnetic field 240, as desired.

The two active MR elements 202, 205 and the two less active MR elements 215, 218 provide a Wheatstone bridge circuit as shown, for example, in FIG. 2. It should be appreciated that, since the two less active MR elements 215, 218 are fabricated similar to the two active MR elements 202, 205, the two less active MR elements 215, 218 have a temperature coefficient essentially the same as the temperature coefficients of the two active MR elements 202, 205. The voltage difference between the nodes 220, 221 will be essentially unaffected by temperature changes, and therefore, the output voltage, Vout, will be similarly unaffected.

While the closed loop magnetic field sensor 200 is shown having two active MR elements 202, 205 and two less active MR elements 215, 218, in an alternate arrangement, a closed loop magnetic field sensor can have more than two or fewer than two active magnetoresistance elements and more than two or fewer than two less active magnetoresistance elements.

While the silicon substrate 204 is shown, it will also be apparent that other substrate materials, including but not limited to, SiGe, GaAs, InGaAs, glass or Alumina (an aluminum oxide material) may be substituted for the silicon substrate 204. In an alternate embodiment, the silicon substrate 204 may be substituted by another substrate (not shown) that includes a ceramic material, including but not limited to $Al_2O_3$. Circuitry similar to the amplifier 222 may be formed, for example, on a separate substrate (not shown), for example, on a silicon substrate, which can be coupled with wire bonds or the like to the ceramic substrate.

While the sensor in FIG. 2 is shown with a closed loop configuration (i.e., driving the GMR to zero field), an open loop configuration may also be used. In other examples, a back-biased configuration may be used to sense the motion of a moving target in a back-biased magnetic field sensor.

In other examples, a sensor may be a current sensor, a position sensor, or a speed sensor.

Figure 4:
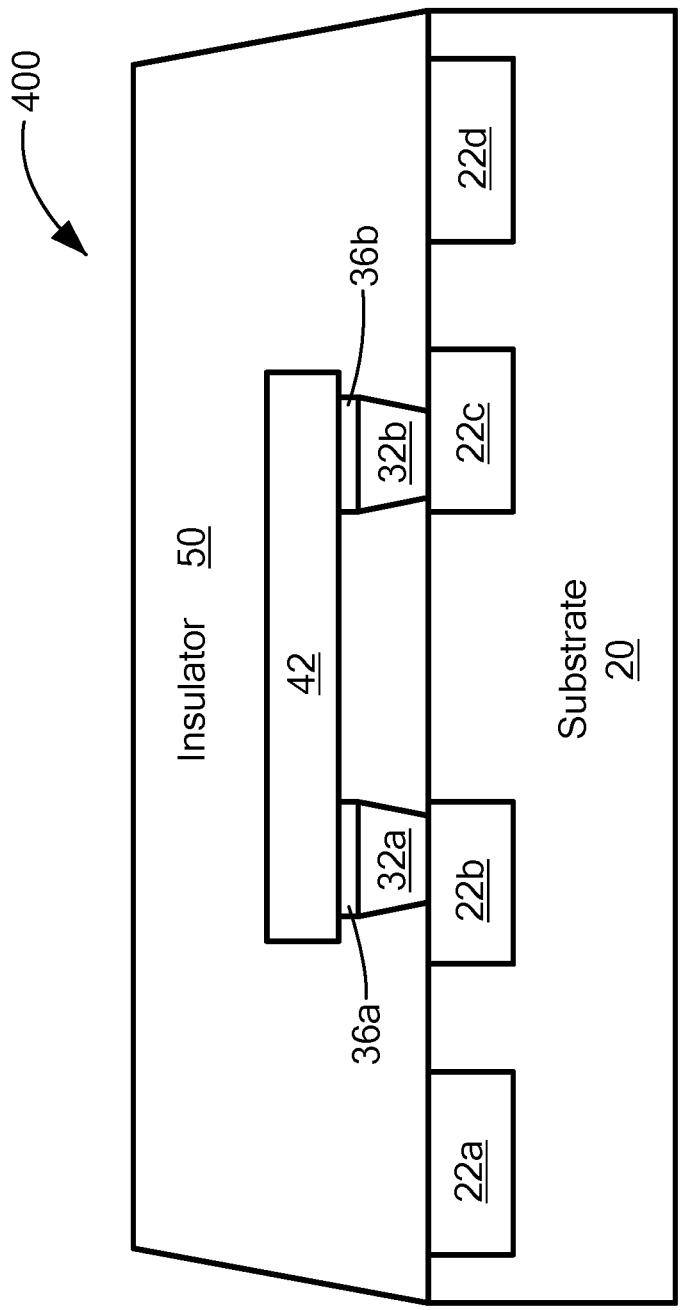
FIGS. 4 to 9 are diagrams of one example to fabricate a temperature-compensated magneto-resistive sensor having at least one active MR element and at least one less active MR element on a single integrated circuit (IC)

Referring to FIGS. 3 to 9, a process 300 is an example of a process to fabricate a temperature-compensated magnetoresistive sensor having at least one active MR element and at least one active MR element on a single IC. Heat is applied to a first MR (302). For example, heat is applied to a semiconductor structure 400 that includes an MR element 42 (FIG. 4). In one example, the semiconductor structure is baked to 300° C. for 15 minutes. The MR element 42 is significantly damaged because the metal layers in the MR element 42 are diffused to the other layers in the MR 42. In other examples, heat is applied using a laser.

In this example, the semiconductor structure 400 also includes a substrate 20 with metal contacts (e.g., metal contacts 22a-22d) at the top surface of the substrate 20. The metal contacts 22b, 22c are electrically connected to the MR element 42 by vias 32a, 32b respectively. The vias 32a, 32b may include a metal cap 36a, 36b respectively. An insulator 50 on the surface of the substrate 20 encapsulates the MR element 42 and the vias 32a, 32b. In some examples, the insulator 50 may be a passivation layer or an oxide layer, or other insulator including but not limited to aluminum oxide, nitride or alumina.

Figure 5:
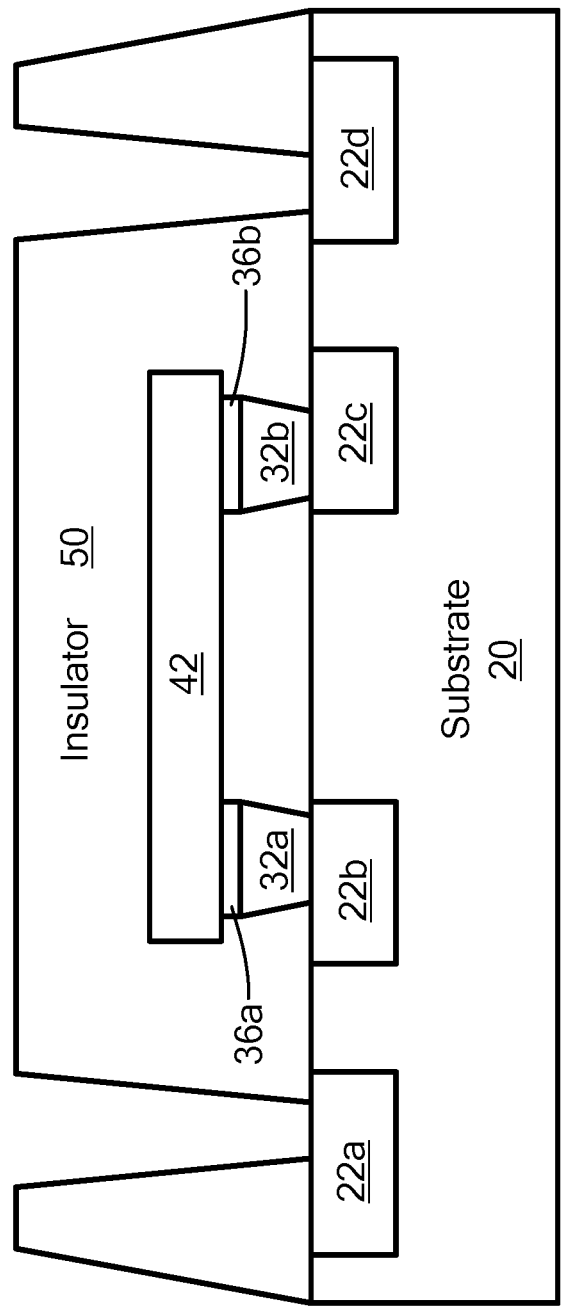
Figure 6:
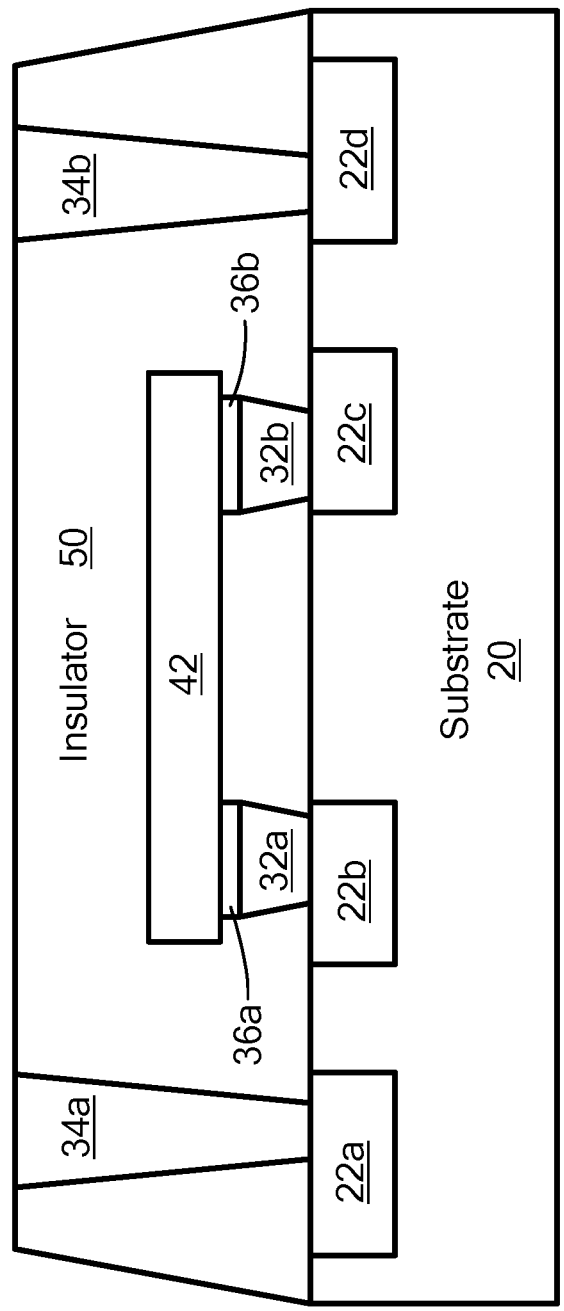

The insulator 50 is etched to form via locations (306) and vias are deposited in the etched locations (312). For example, a via 34a is formed that is electrically connected to the metal contact 22a and a via 34b is formed that is electrically connected to the metal contact 22d (FIGS. 5 and 6).

Figure 7:
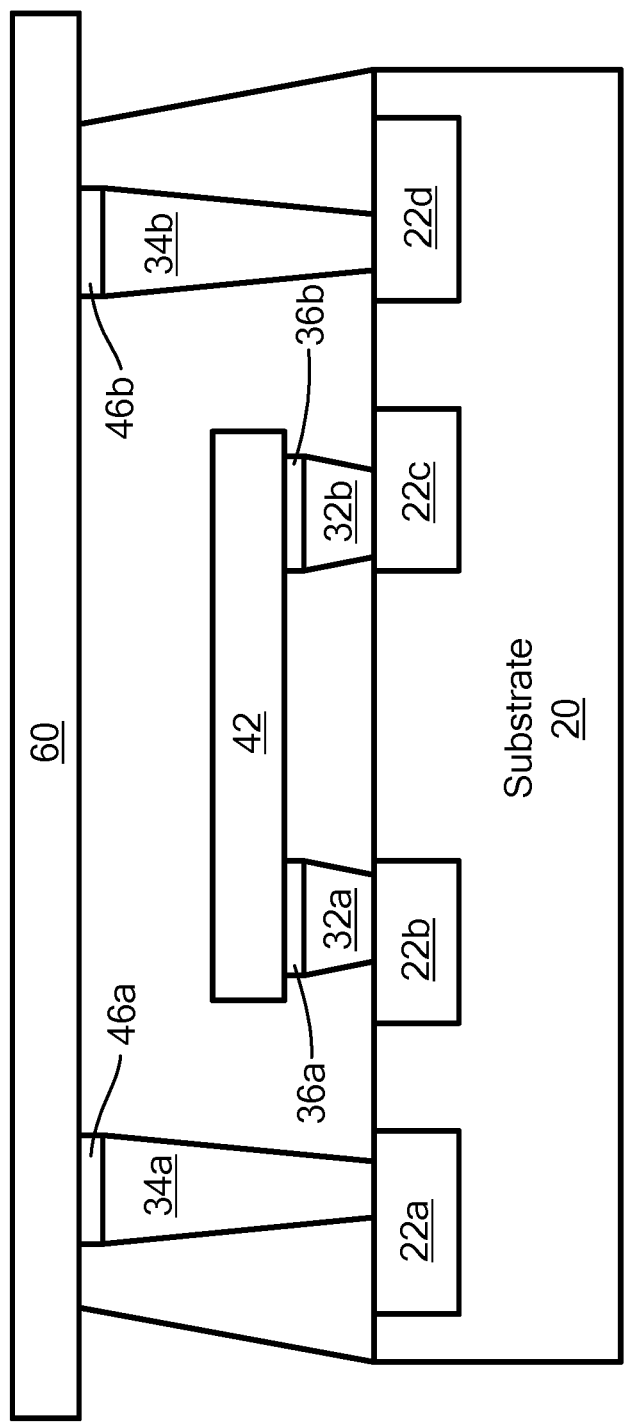

A metal cap is deposited on each via (320), the surface of the metal caps and the passivation layer are polished (320) and a second MR element is deposited (326). For example, metal caps 46a, 46b are deposited on the vias 34a, 34b, the insulator 50 and the metal caps 34a, 34b are polished and an MR element 60 is deposited on the insulator 50 and the metal caps 46a, 46b (FIG. 7). In one particular example, the MR element is fabricated similar to the MR element 42. In one particular example, the MR element 44 is deposited in a plurality of layers (not shown).

Figure 8:
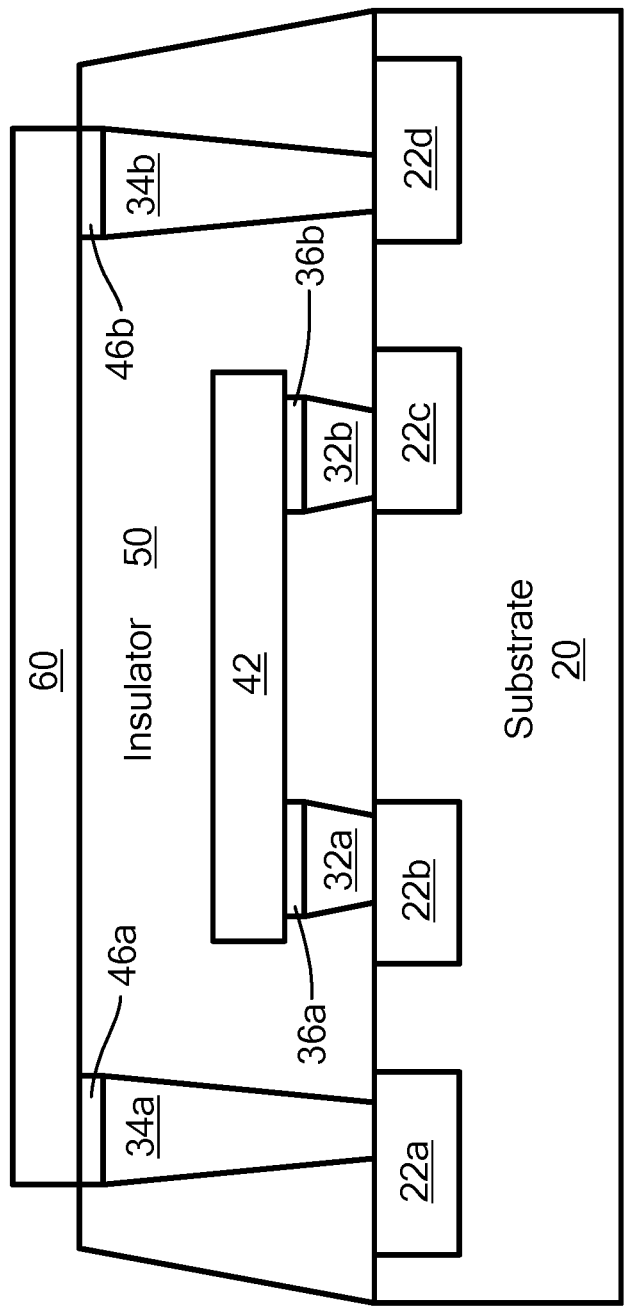
Figure 9:
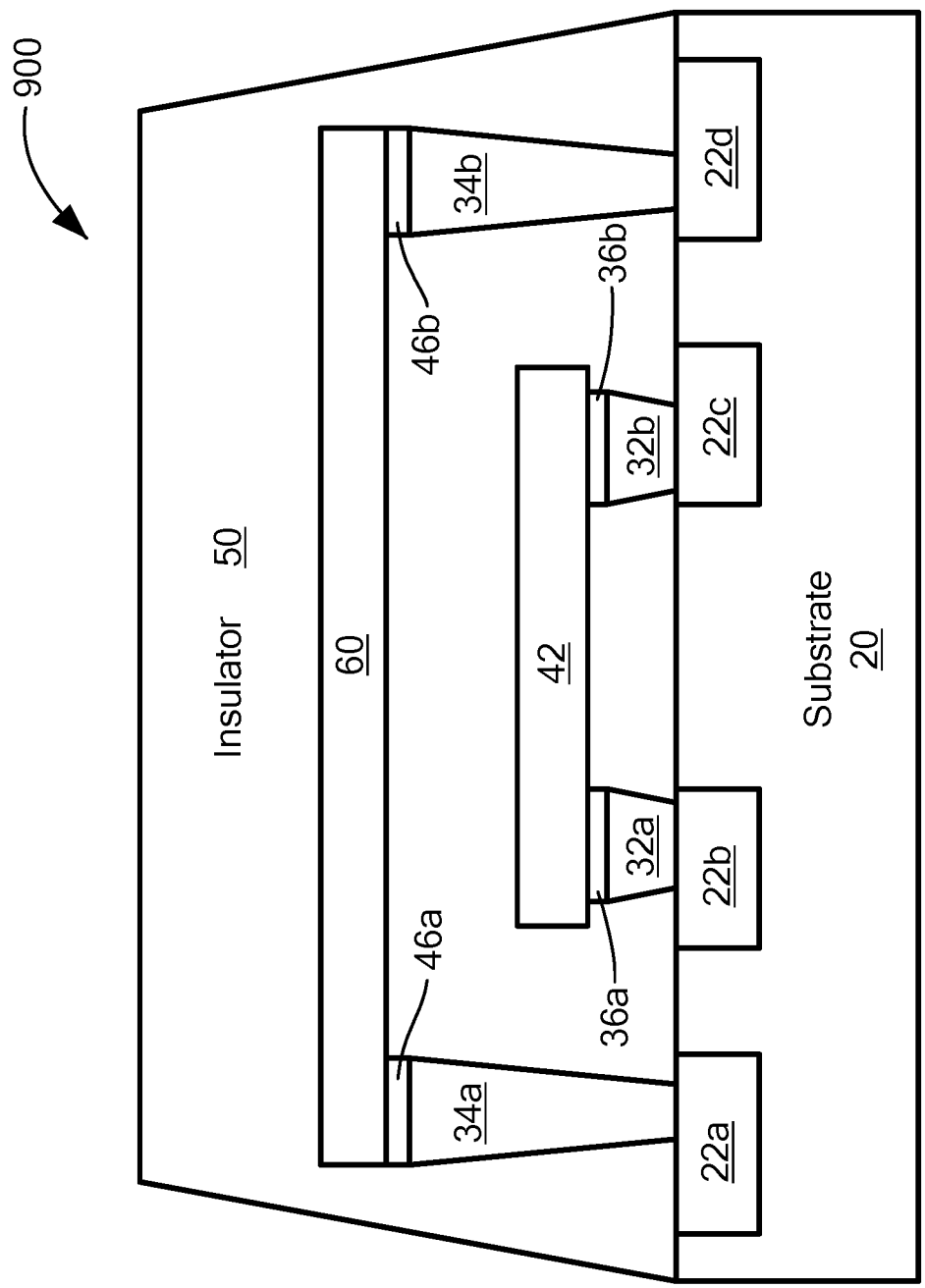

The second MR is etched (332) and an additional insulator is added (336). For example, the second MR 60 is etched and an additional insulator 50 is added to form the semiconductor structure 900 (FIGS. 8 and 9). In this configuration, the second MR element 44 is directly above the first MR element 42.

Figure 10:
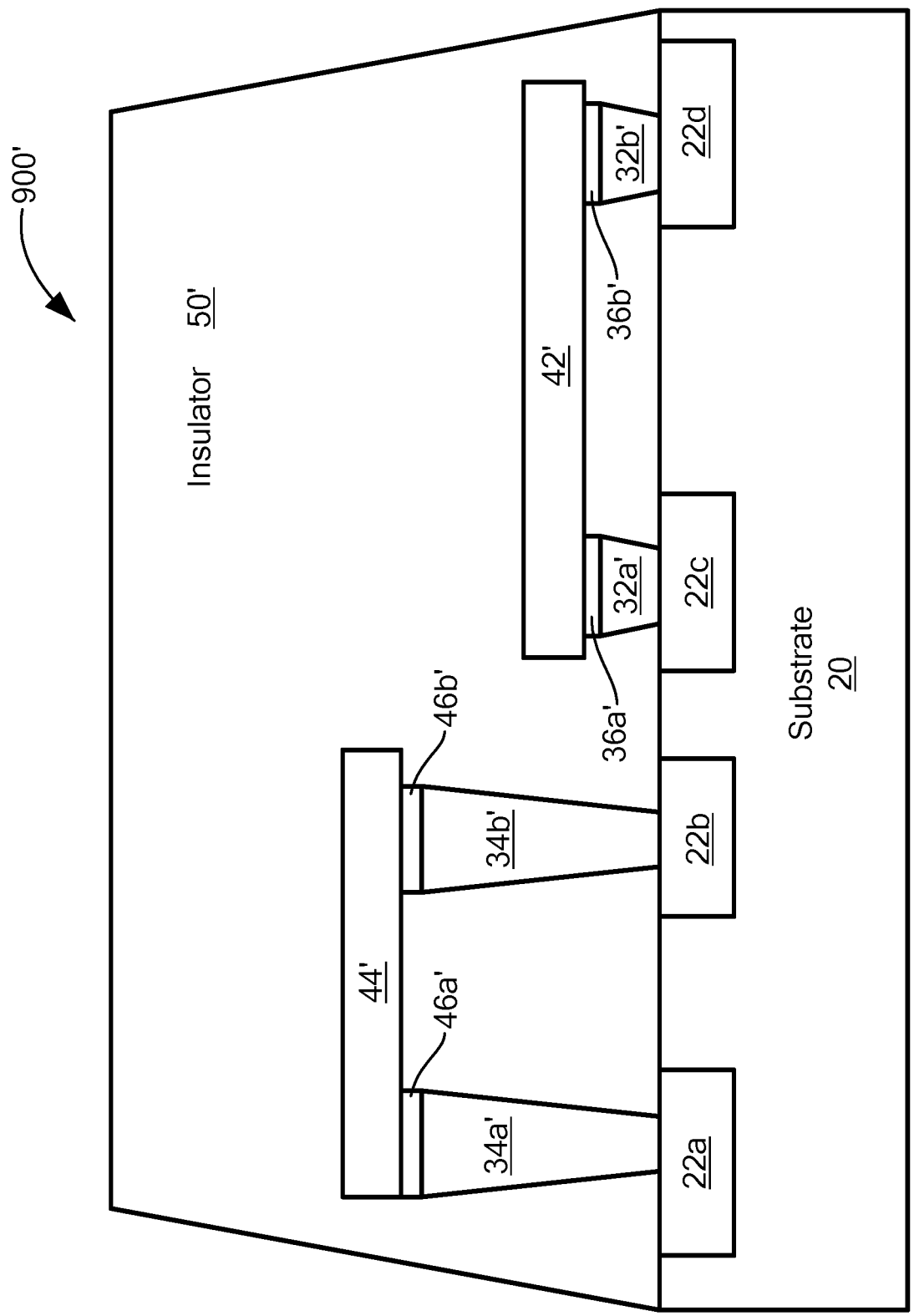
FIG. 10 is a diagram of another example to fabricate a temperature-compensated magneto resistive sensor having at least one active MR element and at least one active MR element on a single IC.

Referring to FIG. 10, the process 300 may be used to also fabricate a semiconductor structure 900' where a first MR element 42' is side-by-side with a second MR element 44'. In this configuration, the second MR element 44' is electrically connected to the metal contact 22a by a via 34a' and a metal cap 46a'; and is electrically connected to the metal contact 22b by a via 34b' and a metal cap 46b'. The first MR element 42' is electrically connected to the metal contact 22c by a via 32a' and a metal cap 36a'; and is electrically connected to the metal contact 22d by a via 32b' and a metal cap 36b'.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method, comprising;
    applying heat to a semiconductor device comprising a first magnetoresistive (MR) element to diffuse at least one metal layer of the first MR element into other layers of the first MR element; and
    fabricating a second MR element on to the semiconductor device after applying the heat,
    wherein applying the heat to the semiconductor device causes the first MR element to have a reduced percentage change in nominal resistance when the first MR element is exposed to a magnetic field.

2. The method of claim 1, wherein fabricating the second MR element on to the semiconductor device after applying the heat comprises fabricating the second MR element side-by-side with the first MR element.

3. The method of claim 1, wherein fabricating the second MR element on to the semiconductor device after applying the heat comprises fabricating the second MR element directly above the first MR element.

4. The method of claim 1, wherein applying heat to the semiconductor device comprises applying heat to render the first MR element to have a first percentage change in nominal resistance in the presence of a magnetic field and wherein fabricating the second MR element on to the semiconductor device comprises fabricating the second MR element to have a second, different percentage change in nominal resistance in the presence of the magnetic field than the first MR element.

5. The method of claim 1, wherein applying heat to the semiconductor device comprises applying heat to render the first MR element to have 10% or less change in nominal resistance in a presence of a magnetic field.

6. The method of claim 1, wherein applying heat to the semiconductor device comprises applying heat to render the first MR element to have 1% or less change in nominal resistance in a presence of a magnetic field.

7. The method of claim 1, wherein applying heat to the semiconductor device comprises baking the semiconductor device to 300° C. for 15 minutes.

8. The method of claim 1, wherein applying the heat comprises applying the heat using a laser.

9. A method, comprising;
    diffusing at least one metal layer of a first magnetoresistive (MR) element into other layers of the first element by applying heat to a semiconductor device that includes the first MR element; and
    fabricating a second MR element on to the semiconductor device after applying the heat,
    wherein the second MR element is not present in the semiconductor device when the heat is applied to the semiconductor device,
    wherein diffusing the at least one metal layer of the first MR element into other layers of the first MR element causes the first MR element to have a reduced percentage change in nominal resistance when the first MR element is exposed to a magnetic field, and
    wherein the percentage change in nominal resistance of the first MR element is lower than a percentage change in nominal resistance of the second MR element when the first MR element and the second MR element are exposed to the magnetic field.

10. The method of claim 9, wherein fabricating the second MR element on to the semiconductor device comprises fabricating the second MR element side-by-side with the first MR element.

11. The method of claim 9, wherein fabricating the second MR element on to the semiconductor device after applying the heat comprises fabricating the second MR element directly above the first MR element.

12. The method of claim 9, wherein applying heat to the semiconductor device comprises applying heat to render the first MR element to have 10% or less change in nominal resistance in a presence of the magnetic field.

13. The method of claim 9, wherein applying heat to the semiconductor device comprises applying heat to render the first MR element to have 1% or less change in nominal resistance in a presence of the magnetic field.

14. The method of claim 9, wherein applying heat to the semiconductor device comprises baking the semiconductor device to 300° C. for 15 minutes.

15. The method of claim 9, wherein applying the heat comprises applying the heat using a laser.

* * * * *